(12) United States Patent
Schuette et al.

(10) Patent No.: US 9,472,633 B1
(45) Date of Patent: Oct. 18, 2016

(54) TRANSISTOR GATE HAVING AN INSULATING LAYER SUPPORT STRUCTURE

(75) Inventors: Michael Schuette, Dallas, TX (US); Andrew Ketterson, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 1100 days.

(21) Appl. No.: 13/305,657

(22) Filed: Nov. 28, 2011

(51) Int. Cl.
*H01L 29/423* (2006.01)
*H01L 29/66* (2006.01)

(52) U.S. Cl.
CPC ... *H01L 29/42316* (2013.01); *H01L 29/66462* (2013.01)

(58) Field of Classification Search
CPC ........... H01L 29/2003; H01L 29/7787; H01L 29/66462; H01L 29/7783; H01L 29/42316
See application file for complete search history.

(56) References Cited

U.S. PATENT DOCUMENTS

| | | | |
|---|---|---|---|
| 5,510,645 A * | 4/1996 | Fitch | H01L 21/7682 257/254 |
| 6,287,979 B1 * | 9/2001 | Zhou et al. | 438/723 |
| 7,378,724 B2 | 5/2008 | Yu et al. | |
| 7,456,443 B2 * | 11/2008 | Saxler et al. | 257/194 |
| 7,622,767 B2 * | 11/2009 | Nogami et al. | 257/317 |
| 2006/0244079 A1 * | 11/2006 | Wang et al. | 257/407 |
| 2009/0078966 A1 * | 3/2009 | Asai et al. | 257/194 |

OTHER PUBLICATIONS

Metze, GG.M., et al.; A Dielectric-Defined Process for the Formation of T-Gate Field-Effect Transistors; IEEE Microwave and Guided Wave Letters, vol. 1, No. 8, Aug. 1991.
Kim, Donghyun, et al.; Recessed 70-nm gate-Length AlGaN/GaN HEMTs Fabricated Using an Al2)3/SiNx Dielectric Layer; IEEE Electron Device Letters, vol. 30, No. 9, Sep. 2009.

* cited by examiner

*Primary Examiner* — Michelle Mandala
(74) *Attorney, Agent, or Firm* — Withrow & Terranova, P.L.L.C.

(57) ABSTRACT

Embodiments include but are not limited to apparatuses and systems including a microelectronic device including a gate, a source pad and a drain pad arranged such that the gate is separated from the source pad and the drain pad by air, and an insulating layer coupled with a portion of the gate such that at least a portion of the insulating layer is separated from the source pad and the drain pad by the air. Methods for making the same also are described.

25 Claims, 11 Drawing Sheets

TRANSISTOR GATE HAVING AN INSULATING LAYER SUPPORT STRUCTURE

TECHNICAL FIELD

Embodiments of the present invention relate generally to microelectronic devices and more particularly to devices including transistor gates having an insulating layer support structure.

BACKGROUND

For various reasons, efforts have been made to reduce gate capacitance. To that end, gate lengths have been reduced. To further reduce gate capacitance, gates have been surrounded by low-dielectric-constant materials such as air in order to reduce parasitic fringing fields.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
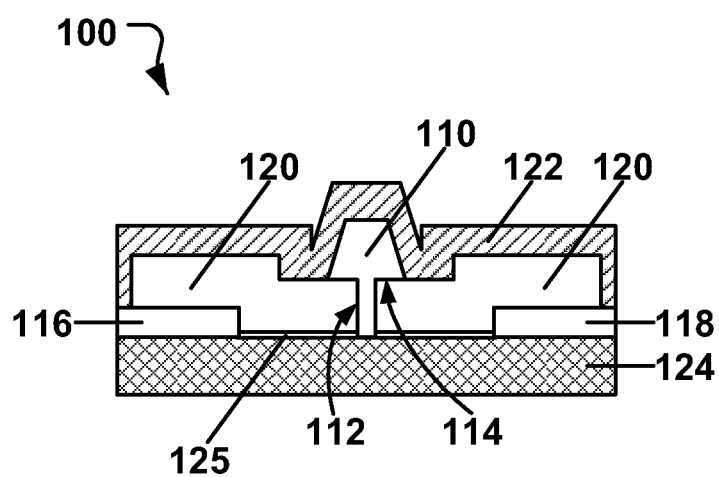
FIG. 1 illustrates a cross-sectional side view of an apparatus including an insulating layer coupled with a cap of a gate such that at least a portion of the insulating layer is separated from a source pad and a drain pad by air, in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The term "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer. Usage of terms like "top" and "bottom" are to assist in understanding, and they are not to be construed to be limiting on the disclosure.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

This disclosure is generally drawn, among other things, to apparatuses and systems including an insulating layer coupled with a portion of a gate such that at least a portion of the insulating layer is separated from a source pad and a drain pad by air. As a short gate trunk (i.e., gate length) relative to an increased gate cap size, and/or an increased gate height-to-length aspect ratio, may be a mechanically unstable geometry that is prone to collapse, the insulating layer may be a support structure for mechanically stabilizing the gate, especially for free-standing gates surrounded, at least in part, by air.

FIG. 1 is a sectional view of an apparatus 100 including a gate 110 having a trunk 112 and a cap 114 coupled to the trunk 112, and a source pad 116 and a drain pad 118 arranged such that the trunk 112 of the gate 110 is separated from the source pad 116 and the drain pad 118 by air 120. The apparatus 100 also includes an insulating layer 122 (referred to hereinafter as "scaffold insulating layer") coupled with the cap 114 of the gate 110 such that at least a portion of the scaffold insulating layer 122 is separated from the source pad 116 and the drain pad 118 by the air 120. The source pad 116, drain pad 118, and gate 110 may be coupled with a substrate 124. The substrate 124 may include a passivation layer 125.

In various embodiments, the substrate 124, the gate 110, the source pad 116, and the drain pad 118 may form a field-effect transistor. In various ones of these embodiments, the substrate 124 may include one or more group III-V layers. The field-effect transistor may be a high electron mobility transistor (HEMT) such as, for example, a GaN-based HEMT. In some of these embodiments, the GaN-based HEMT may be an InAlN/AlN/GaN HEMT.

In various embodiments, the scaffold insulating layer 122 may essentially be a structure that provides mechanical support to the gate 110 to resist collapse of the gate 110. As the trunk 112 of the gate 110 is short in the lateral direction (i.e., the gate length along the x-direction in the drawings) relative to the cap 114, the gate 110 may be prone to collapsing without the support of the scaffold insulating layer 122. The tendency to collapse may be particularly increased for situations in which the gate 110 is "free-standing" such that at least a portion of the gate 110 is separated from the source pad 116 and the drain pad 118 by air 120. As noted elsewhere herein, while such free-standing gates may advantageously have a lower parasitic fringing capacitance relative to gates separated from source and drain pads by an insulating material (such as silicon oxide or silicon nitride for example) other than air, these free-standing gates also are more likely to collapse given the minimal support around the gate.

Figure 2:
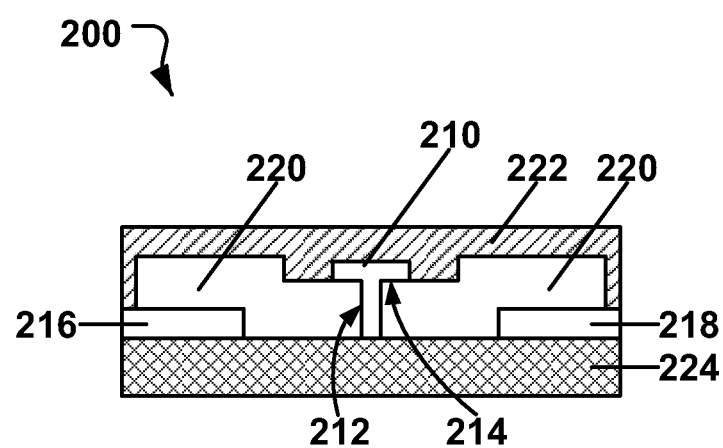
FIG. 2 illustrates a cross-sectional side view of another apparatus including an insulating layer coupled with a cap of a gate such that at least a portion of the insulating layer is separated from a source pad and a drain pad by air, in accordance with various embodiments of the present invention.

As illustrated in FIG. 1, the gate 110 generally is mushroom-shaped (or trapezoidal-shaped), but other gate shapes may be possible within the scope of various embodiments of the present invention. FIG. 2, for example, illustrates an apparatus 200 including a t-gate 210 having a having a trunk 212 and a cap 214 substantially perpendicularly coupled with the trunk 212, and a source pad 216 and a drain pad 218 arranged such that the trunk 212 of the t-gate 210 is separated from the source pad 216 and the drain pad 218 by air 220. The apparatus 200 also includes a scaffold insulating layer 222 coupled with the cap 214 of the t-gate 210 such that at least a portion of the scaffold insulating layer 222 is separated from the source pad 216 and the drain pad 218 by the air 220. Like the apparatus 100 of FIG. 1, the source pad 216, drain pad 218, and gate 210 of the apparatus 200 may be coupled with a substrate 224.

Similarly to the gate 110 of FIG. 1, the trunk 212 of the t-gate 210 of FIG. 2 is laterally short relative to the cap 214 and so the scaffold insulating layer 222 may also provide mechanical support to the t-gate 210 to resist collapse of the gate 210.

Figure 3:
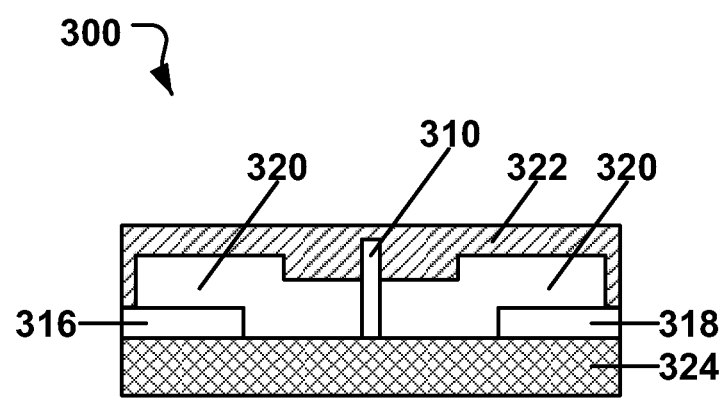
FIG. 3 illustrates a cross-sectional side view of another apparatus including an insulating layer coupled with a cap of a gate such that at least a portion of the insulating layer is separated from a source pad and a drain pad by air, in accordance with various embodiments of the present invention.

As noted elsewhere herein, gates having an increased gate height-to-length aspect ratio may be also be a mechanically unstable geometry that may be prone to collapse. FIG. 3 illustrates such an example in which an apparatus 300 includes a gate 310 that is substantially taller than it is long, which may be a particularly unstable geometry when the gate 310 is separated from the source pad 316 and the drain pad 318 by air 320. The apparatus 300 also includes a scaffold insulating layer 322 to provide mechanical support to the gate 310 to resist collapse of the gate 310. Similarly to the embodiments depicted in FIG. 1 and FIG. 2, the scaffold insulating layer 322 may be coupled with a portion of the gate 310 such that at least a portion of the scaffold insulating layer 322 is separated from the source pad 316 and the drain pad 318 by the air 320. The source pad 316, drain pad 318, and gate 310 of the apparatus 300 may also be coupled with a substrate 324.

An example method for forming the apparatus 100 of FIG. 1 is illustrated in FIGS. 4-8 by way of sectional views of the apparatus 100 at various stages of the method. It is noted that it will be clear that various operations of the example method may also be suitable for forming the apparatus 200 of FIG. 2 and the apparatus 300 of FIG. 3.

Figure 4:
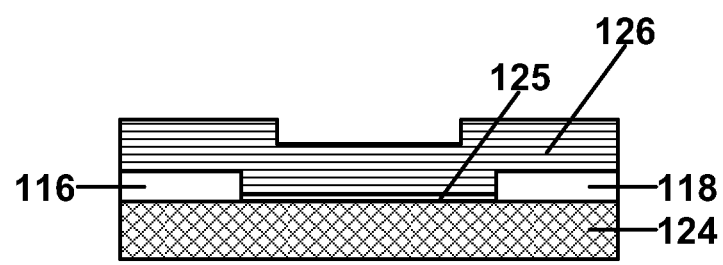
FIGS. 4-8 illustrate various stages of a method for making an apparatus including an insulating layer coupled with a cap of a gate such that at least a portion of the insulating layer is separated from a source pad and a drain pad by air, in accordance with various embodiments of the present invention.

As illustrated in FIG. 4, a trunk insulating layer 126 may be formed over portions of the substrate 124. In various embodiments, the trunk insulating layer 126 may be blanket deposited over the source pad 116, drain pad 118, and the region of the substrate 124 between the source pad 116 and the drain pad 118. Although not illustrated, in various embodiments, the trunk insulating layer 126 may be deposited over part or all of the region between the source pad 116 and drain pad 118, and not on the source pad 116 and drain pad 118.

Optionally, a passivation layer 125 may be formed on the substrate 124 as illustrated prior to forming the trunk insulating layer 126.

Figure 5:
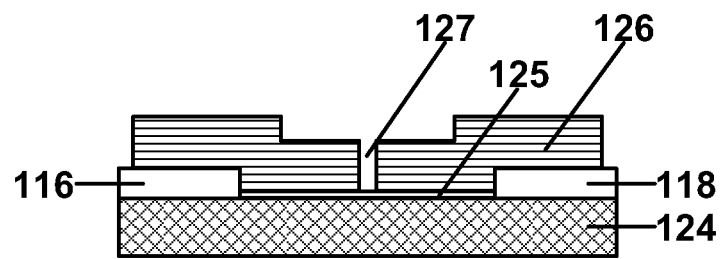
Figure 6A:
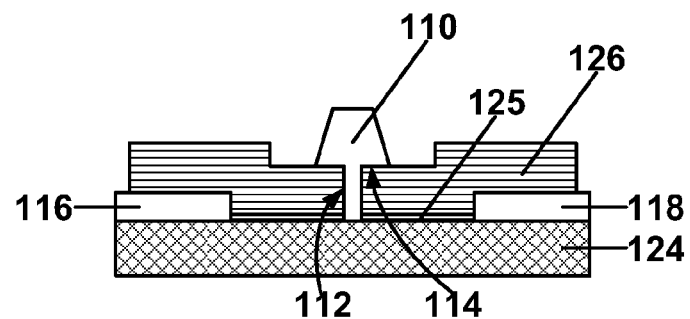
Figure 6B:
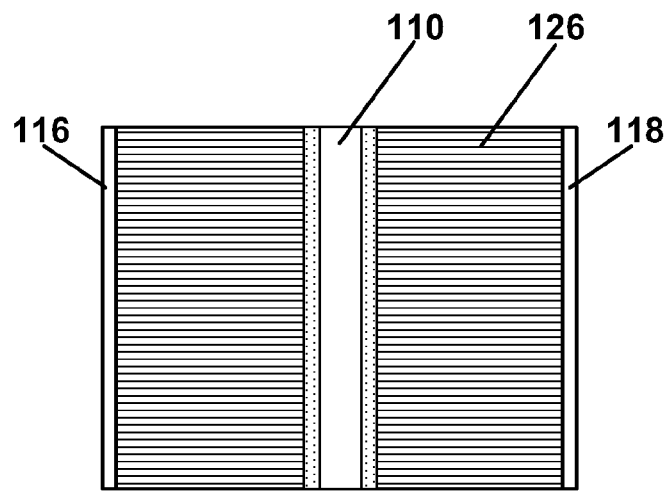

The trunk insulating layer 126 may be etched to form a trench 127 as illustrated in FIG. 5. The gate 110 may then be formed in the trench as illustrated in FIG. 6A (top view is illustrated in FIG. 6B). The gate 110 is mushroom-shaped in the illustrated embodiment, but may be t-shaped or another shape as discussed elsewhere herein.

In various embodiments, the gate 110 may be formed prior to forming the trunk insulating layer 126 (not illustrated).

Figure 7A:
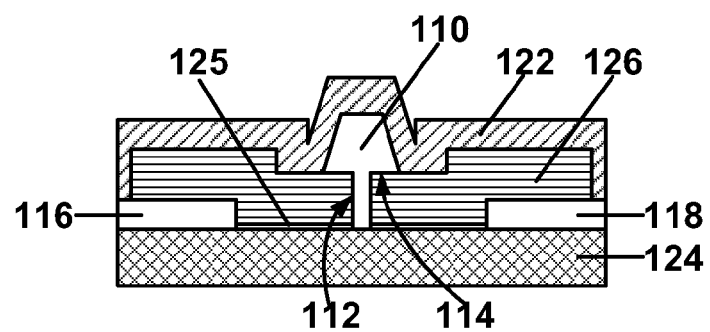
Figure 7B:
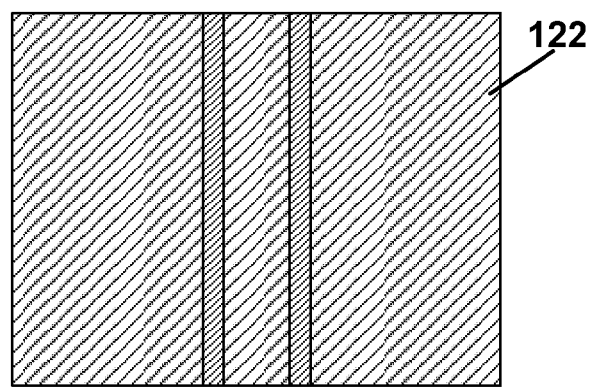

The scaffold insulating layer 122 may then be formed over the trunk insulating layer 126 and exposed portions of the gate 110, source pad 116, and drain pad 118 as illustrated in FIG. 7A (top view is illustrated in FIG. 7B).

Figure 8:
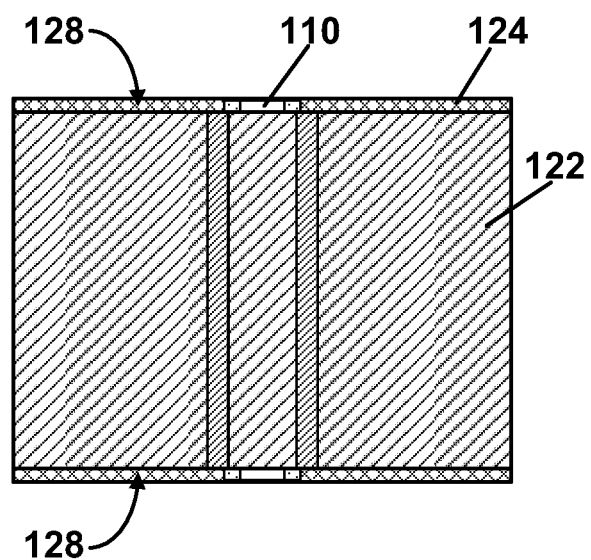

After forming the scaffold insulating layer 122, at least a portion of the trunk insulating layer 126 may be etched in order to separate the source pad 116 and the drain pad 118 from the gate 110 by air. To that end, one or more portions of the scaffold insulating layer 122 may be etched to form opening(s) 128 through which the trunk insulating layer 126 is exposed, as illustrated in FIG. 8. Then, the trunk insulating layer 126 may be etched through the opening(s) 128 in the scaffold insulating layer 122 to form the apparatus 100 illustrated in FIG. 1.

Materials for forming the trunk insulating layer 126 and the scaffold insulating layer 122 may be selected to be dissimilar such that the trunk insulating layer 126 is selectively etched over the scaffold insulating layer 122 during the operation for etching the trunk insulating layer 126 through the opening(s) 128 in the scaffold insulating layer 122. In various embodiments, the scaffold insulating layer 122 may comprise silicon oxide, silicon carbide, or silicon nitride, while the trunk insulating layer 126 may comprise a dissimilar one of silicon oxide, aluminum oxide, or silicon nitride. For example, the scaffold insulating layer 122 may comprise silicon carbide, while the trunk insulating layer 126 may comprise silicon oxide, aluminum oxide, or silicon nitride. In other embodiments, the scaffold insulating layer 122 may comprise silicon oxide, while the trunk insulating layer 126 may comprise aluminum oxide or silicon nitride.

After etching the trunk insulating layer 126, the opening(s) 128 in the scaffold insulating layer 122 may be re-sealed (not illustrated, but a top view would be similar to FIG. 7B). The scaffold insulating layer 122 may be re-sealed using the same material of which the scaffold insulating layer 122 is comprised or another material.

Figure 9:
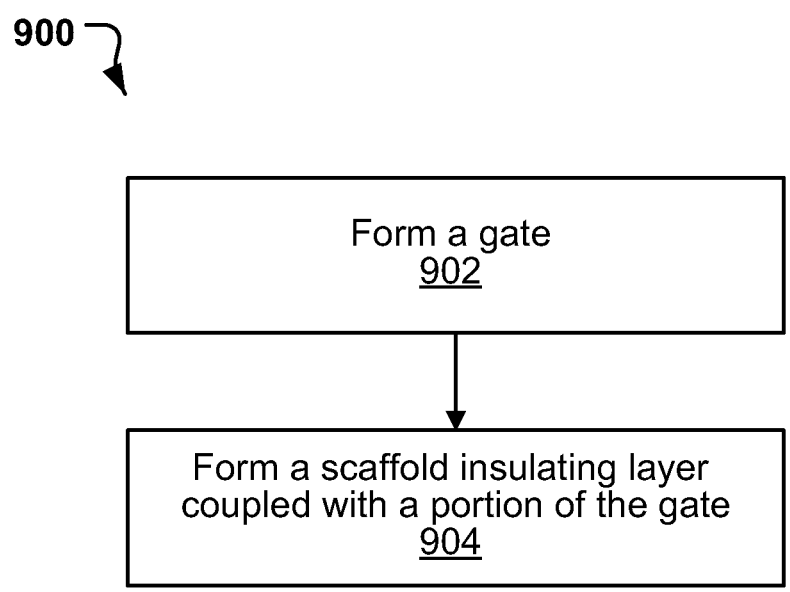
FIG. 9 is a flow diagram of some of the operations associated with a method for making an apparatus including an insulating layer coupled with a cap of a gate such that at least a portion of the insulating layer is separated from a source pad and a drain pad by air, in accordance with various embodiments.
Figure 10:
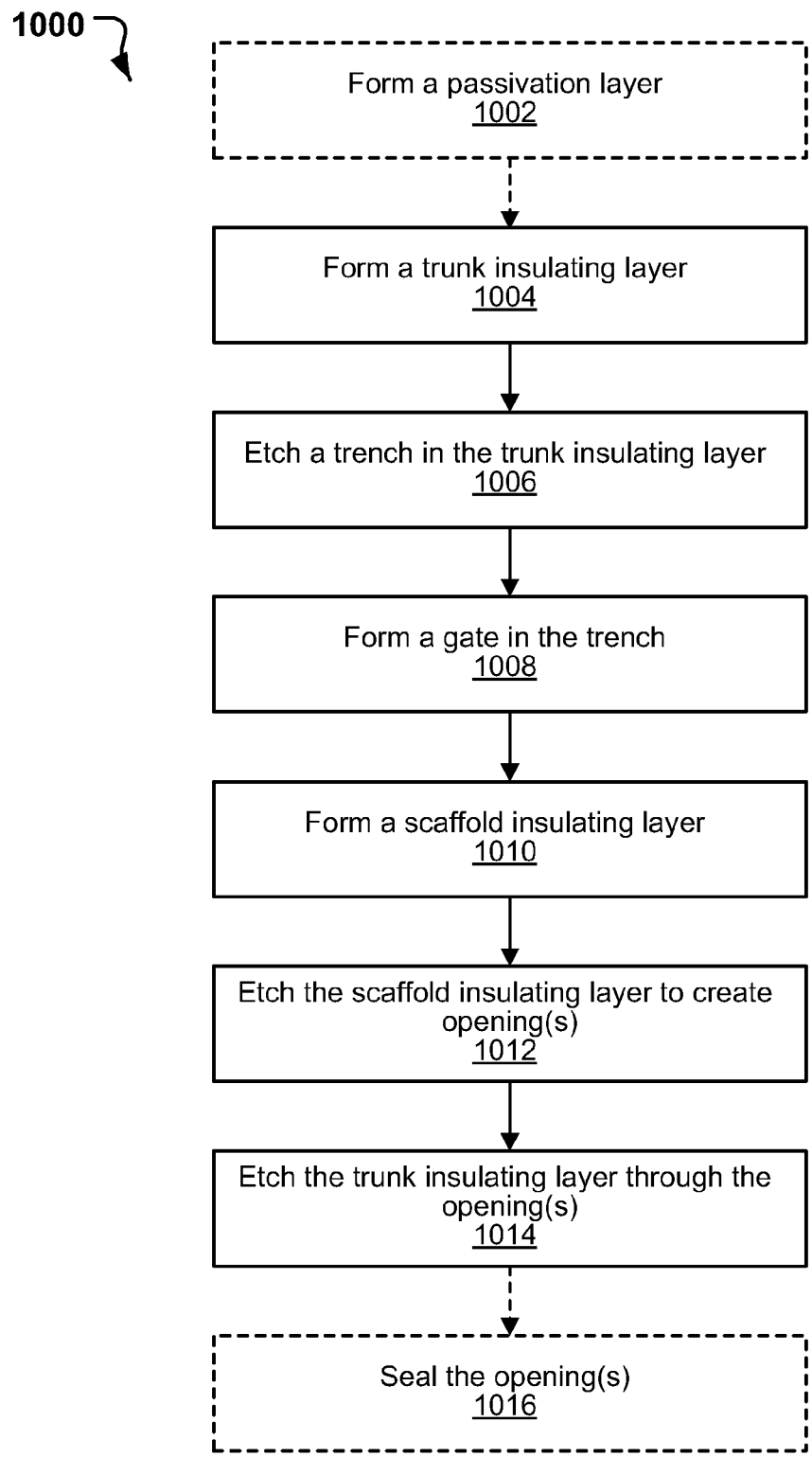
FIG. 10 is a flow diagram of some of the operations associated with a method for making an apparatus including an insulating layer coupled with a cap of a gate such that at least a portion of the insulating layer is separated from a source pad and a drain pad by air, in accordance with various embodiments.

FIG. 9 and FIG. 10 are flow diagrams of some of the operations associated with method 900, 1000, respectively, for making an apparatus (100, 200, or 300 described herein, for example) including an insulating layer coupled with a portion of a gate such that at least a portion of the insulating layer is separated from a source pad and a drain pad by air, in accordance with various embodiments.

Turning now to FIG. 9, a method for making an apparatus including an insulating layer coupled with a portion of a gate such that at least a portion of the insulating layer is separated from a source pad and a drain pad by air may include one or more functions, operations, or actions as is illustrated by block 902 and/or block 904.

Processing for the method 900 may start with block 902 by forming a gate. The gate may be a t-gate or a mushroom gate. In some embodiments, the gate may be any a gate of any other shape. The gate may be formed on a substrate. Although not illustrated in the flow diagram, the method may further include forming a source pad and a drain pad on the substrate.

From block 902, the method 900 may proceed to block 904 by forming a scaffold insulating layer such that the scaffold insulating layer is coupled with a portion of the gate and at least a portion of the scaffold insulating layer is separated from a source pad and a drain pad by air.

Turning now to FIG. 10, a method for forming the scaffold insulating layer may include one or more functions, operations, or actions as is illustrated by block 1002, block 1004, block 1006, block 1008, block 1010, and/or block 1012.

Processing for the method 1000 may optionally start with block 1002 by forming a passivation layer on the substrate including the gate. The substrate may include the source pad and the drain pad.

From block 1002, the method 1000 may proceed to block 1004 by forming a trunk insulating layer over the substrate (and the passivation layer when present). The trunk insulating layer may also cover at least a portion of the source pad and the drain pad.

From block 1004, the method 1000 may proceed to block 1006 by etching a trench in the trunk insulating layer.

From block 1006, the method 1000 may proceed to block 1008 by forming a gate in the trench in the trunk insulating layer. In various embodiments, the gate may be formed prior to forming the trunk insulating layer (not illustrated).

From block 1008, the method 1000 may proceed to block 1010 by forming a scaffold insulating layer on the trunk insulating layer. The scaffold insulating layer also covers at least a portion of the gate. For t-gates or mushroom gates, the scaffold insulating layer covers at least a portion of the cap of the gate.

From block 1010, the method 1000 may proceed to block 1012 by etching a portion of the scaffold insulating layer to create opening(s) in the scaffold insulating layer.

From block 1012, the method 1000 may proceed to block 1014 by etching the trunk insulating layer through the opening(s) in the scaffold insulating layer. As discussed elsewhere herein, the scaffold insulating layer and the trunk insulating layer may be formed of dissimilar materials such that the trunk insulating layer is selectively etched over the scaffold insulating layer.

From block 1014, the method 1000 may optionally proceed to block 1016 by sealing the opening(s) of the scaffold insulating layer.

Figure 11:
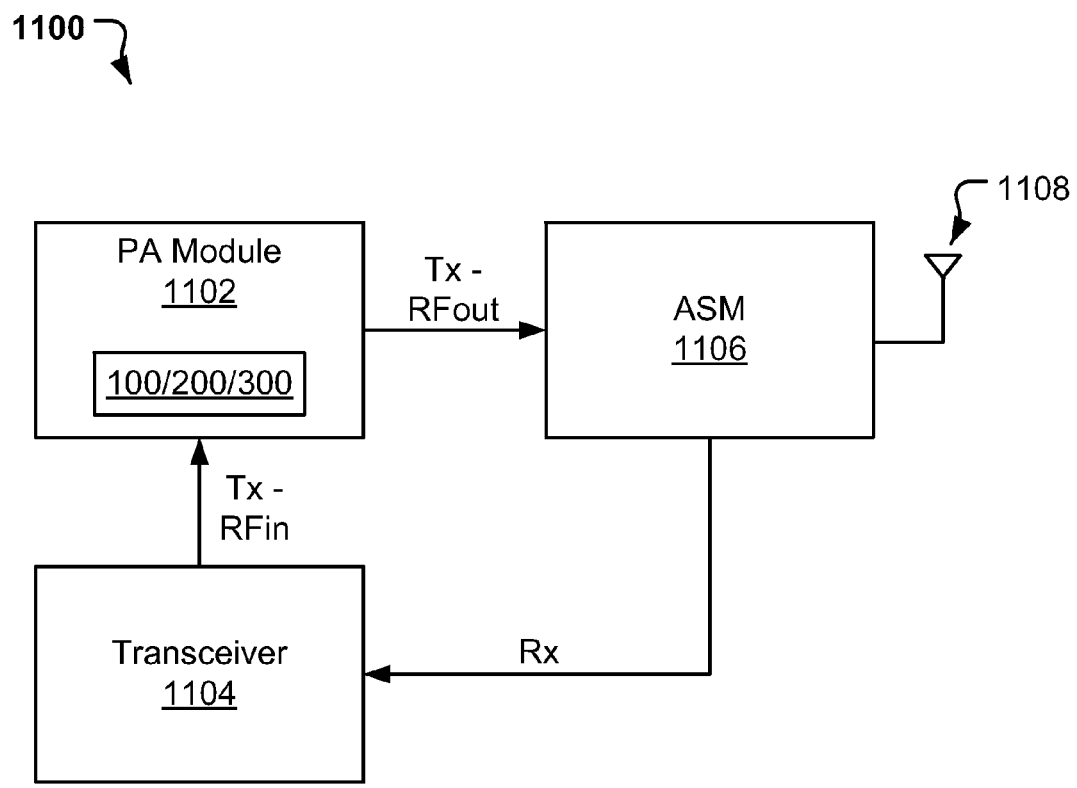
FIG. 11 is a block diagram of a system incorporating an apparatus including an insulating layer coupled with a cap of a gate such that at least a portion of the insulating layer is separated from a source pad and a drain pad by air, in accordance with various embodiments.

Embodiments of apparatuses described herein may be incorporated into various other apparatuses and systems. A block diagram of an example system 1100 is illustrated in FIG. 11. For example, the power amplifier module 1102 may include one or more of the apparatuses 100, 200, 300 including an insulating layer coupled with a portion of a gate such that at least a portion of the insulating layer is separated from a source pad and a drain pad by air described herein. As illustrated, the system 1100 may include a transceiver 1104 coupled with the power amplifier module 1102 as illustrated.

The power amplifier module 1102 may receive an RF input signal, RFin, from the transceiver 1104. The power amplifier module 1102 may amplify the RF input signal, RFin, to provide the RF output signal, RFout. The RF input signal, RFin, and the RF output signal, RFout, may both be part of a transmit chain, respectively noted by Tx—RFin and Tx—RFout in FIG. 11.

The amplified RF output signal, RFout, may be provided to an antenna switch module (ASM) 1106, which effectuates an over-the-air (OTA) transmission of the RF output signal, RFout, via an antenna structure 1108. The ASM 1106 may also receive RF signals via the antenna structure 1108 and couple the received RF signals, Rx, to the transceiver 1104 along a receive chain.

In various embodiments, the antenna structure 1108 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1100 may be any system including power amplification. In various embodiments, the system 1100 may be particularly useful for power amplification at high radio-frequency power and frequency. For example, the system 1100 may be suitable for any one or more of terrestrial and satellite communications, radar systems, and possibly in various industrial and medical applications. More specifically, in various embodiments, the system 1100 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
   a substrate;
   a gate extending upward from the substrate;
   a source pad and a drain pad on the substrate; and
   a scaffold insulating layer that resides over and is coupled to a top portion of the gate and extends in a first direction over the source pad and in a second direction over the drain pad wherein:
  a first cavity that extends over the source pad and is defined on a first side of the gate in part by first portions of the gate, the substrate, a top portion of the source pad, and the scaffold insulating layer; and
  a second cavity that extends over the drain pad and is defined on a second side of the gate in part by second portions of the gate, the substrate, a top portion of the drain pad, and the scaffold insulating layer.

2. The apparatus of claim 1, wherein the gate includes a trunk and a cap coupled to the trunk, and wherein the source pad and the drain pad are arranged such that the trunk of the gate is separated from the source pad and the drain pad by the air.

3. The apparatus of claim 1, wherein the gate is a t-gate or a mushroom-shaped gate.

4. The apparatus of claim 2, wherein the portion of the gate includes the cap of the gate, and wherein the scaffold insulating layer is coupled with the cap of the gate.

5. The apparatus of claim 1, wherein the at least the portion of the scaffold insulating layer is separated from the substrate by the air, and wherein at least another portion of the scaffold insulating layer is coupled with the source pad and the drain pad.

6. The apparatus of claim 1, wherein the scaffold insulating layer comprises silicon oxide, silicon carbide, or silicon nitride.

7. The apparatus of claim 1, wherein the substrate, the gate, the source pad, and the drain pad form a field-effect transistor.

8. The apparatus of claim 7, wherein the field-effect transistor is a high electron mobility transistor.

9. A method comprising:
  forming a gate, a source pad, and a drain pad on a substrate; and
  forming a scaffold insulating layer such that the scaffold insulating layer resides over and is coupled to a top portion of the gate and extends in a first direction over the source pad and in a second direction over the drain pad wherein:
    a first cavity that extends over the source pad and is defined on a first side of the gate in part by first portions of the gate, the substrate, a top portion of the source pad, and the scaffold insulating layer; and
    a second cavity that extends over the drain pad and is defined on a second side of the gate in part by second portions of the gate, the substrate, a top portion of the drain pad, and the scaffold insulating layer.

10. The method of claim 9, wherein the gate includes a trunk and a cap coupled to the trunk, and wherein the forming the gate comprises forming the gate on a substrate such that the trunk is coupled with the substrate.

11. The method of claim 10, wherein the substrate includes a passivation layer.

12. The method of claim 9, wherein the scaffold insulating layer comprises a first insulating layer, wherein the method further comprises forming a second insulating layer and forming a trench in the second insulating layer, and wherein the forming the gate comprises forming the gate in the trench and the forming the first insulating layer comprises forming the first insulating layer on the second insulating layer.

13. The method of claim 12, wherein the first insulating layer comprises silicon oxide, silicon carbide, or silicon nitride, and wherein the second insulating layer comprises silicon nitride, silicon oxide, or aluminum oxide.

14. The method of claim 12, wherein the forming the first insulating layer further comprises, after the forming the first insulating layer on the second insulating layer, etching the second insulating layer.

15. The method of claim 12, wherein the forming the first insulating layer further comprises, after the forming the first insulating layer on the second insulating layer:
  etching a portion of the first insulating layer to expose the second insulating layer; and
  etching the second insulating layer.

16. The method of claim 15, further comprising sealing the portion of the first insulating layer.

17. A system comprising:
  a microelectronic device configured to facilitate transmission and reception of signals, the microelectronic device including:
    a substrate;
    a gate having a bottom portion coupled to the substrate;
    a source pad and a drain pad coupled to the substrate; and
    a scaffold insulating layer that resides over and is coupled to a top portion of the gate and extends in a first direction over the source pad and in a second direction over the drain pad wherein:
      a first cavity that extends over the source pad and is defined on a first side of the gate in part by first portions of the gate, the substrate, a top portion of the source pad, and the scaffold insulating layer; and
      a second cavity that extends over the drain pad and is defined on a second side of the gate in part by second portions of the gate, the substrate, a top portion of the drain pad, and the scaffold insulating layer; and
    an antenna operatively coupled to the microelectronic device to transmit and receive the signals.

18. The system of claim 17, wherein the system is a mobile phone, a smart phone, a laptop computer, a personal digital assistant, a gaming device, a music player, and a video player, a radar device, or a satellite communication device.

19. The apparatus of claim 1, wherein the gate comprises the top portion and a trunk that extends between the top portion and the substrate, the top portion extending laterally from either side of the trunk to form a cap.

20. The apparatus of claim 19, wherein the first cavity is further defined by a first bottom portion of the cap and a first side portion of the trunk, and second cavity is further defined by a second bottom portion of the cap and a second side portion of the trunk.

21. The apparatus of claim 1, wherein the scaffold insulating layer comprises a first side wall, a second side wall, and a top section that extends between the first side wall and the second side wall such that:
  the top portion of the gate is coupled to the top section;
  the first cavity is further defined by the first side wall; and
  the second cavity is further defined by the second side wall.

22. The apparatus of claim 21, wherein the first side wall extends to the source pad, and the second side wall extends to the drain pad.

23. The apparatus of claim 22, wherein the gate comprises the top portion and a trunk that extends between the top portion and the substrate, the top portion extending laterally from either side of the trunk to form a cap.

24. The apparatus of claim 23, wherein the first cavity is further defined by a first bottom portion of the cap and a first side portion of the trunk, and the second cavity is further defined by a second bottom portion of the cap and a second side portion of the trunk.

25. The apparatus of claim 1, wherein the scaffold insulating layer further extends downward to the top portion of the source pad to further define the first cavity and downward to the top portion of the drain pad to further define the second cavity.

* * * * *